United States Patent [19]

Miyazaki et al.

[11] Patent Number: 4,700,364
[45] Date of Patent: Oct. 13, 1987

[54] FSK WITH CONTINUOUS PHASE AND CONTINUOUS SLOPE AT BIT TRANSITIONS

[75] Inventors: Tomohiro Miyazaki; Tetsu Koyama; Shinichi Koike, all of Tokyo, Japan

[73] Assignee: NEC Corporation, Tokyo, Japan

[21] Appl. No.: 781,587

[22] Filed: Sep. 30, 1985

[30] Foreign Application Priority Data

Sep. 28, 1984 [JP] Japan ............................... 59-202033

[51] Int. Cl.$^4$ ........................................... H04L 27/12
[52] U.S. Cl. ................................. 375/62; 332/16 R; 375/44; 375/49; 375/51
[58] Field of Search ............ 360/43; 364/718; 332/1, 332/16 R, 18, 9 R, 10; 375/45, 47, 49, 60, 62, 64, 66, 37, 44, 51, 52, 57, 58, 67; 328/164

[56] References Cited

U.S. PATENT DOCUMENTS

| | | | |
|---|---|---|---|
| 3,048,784 | 8/1962 | Scherer | 375/37 |
| 3,223,925 | 12/1965 | Florac, Jr. et al. | 375/66 |
| 3,325,595 | 6/1967 | Dascotte | 375/55 |
| 3,377,625 | 4/1968 | Filipowsky | 375/37 |
| 3,987,374 | 10/1976 | Jones, Jr. | 332/18 |
| 4,339,724 | 7/1982 | Feher | 328/164 |
| 4,410,955 | 10/1983 | Burke et al. | 364/718 |

Primary Examiner—Benedict V. Safourek
Attorney, Agent, or Firm—Sughrue, Mion, Zinn, Macpeak, and Seas

[57] ABSTRACT

A FSK code with reduced high frequency content is generated. First through fourth waveforms are provided to a selector which selects one of the four waveforms in accordance with a control signal which, in turn, is generated in accordance with a state indication signal identifying the presently selected one of the four waveforms. A D/A converter converts the selected digital waveform data to an analog waveform signal. First and second of the digital waveform data represent $+\sin\theta$ and $-\sin\theta$, and third and fourth of the digital waveform data represent $+f(\theta)$ and $-f(\theta)$, respectively, where $$f(\theta) = a + b\left(\frac{\theta}{\pi} - 1\right)^2 + c(--1)^4,$$

wherein $0 \leq \theta \leq 2\pi$ and a, b and c are nonzero coefficients.

4 Claims, 22 Drawing Figures

FIG. 7A

| ADDRESS | | OUTPUT | | | STATE |
|---|---|---|---|---|---|
| INPUT DATA | COUNTER OUTPUT | DATA | STATE INDICATION BIT | | |
| | | | S1 | S2 | |
| 1 | 0000 ---- 1111 | DATA OF WAVEFORM A | 0 | 0 | 1 |
| 1 | 0000 ---- 1111 | DATA OF WAVEFORM B | 1 | 0 | 2 |
| 0 | 0000 ---- 1111 | DATA OF WAVEFORM C | 0 | 1 | 3 |
| 0 | 0000 ---- 1111 | DATA OF WAVEFORM D | 1 | 1 | 4 |

FIG. 7B

| STATE INDICATION BIT | | DATA | CONTROL SIGNAL |
|---|---|---|---|
| S1 | S2 | | |
| 0 | 0 | 1 | 0 0 (ROM 2A) |
| 1 | 1 | 1 | 0 0 (ROM 2A) |
| 1 | 0 | 1 | 1 0 (ROM 2B) |
| 0 | 1 | 1 | 1 0 (ROM 2B) |
| 1 | 1 | 0 | 0 1 (ROM 3A) |
| 0 | 0 | 0 | 0 1 (ROM 3A) |
| 0 | 1 | 0 | 1 1 (ROM 3B) |
| 1 | 0 | 0 | 1 1 (ROM 3B) |

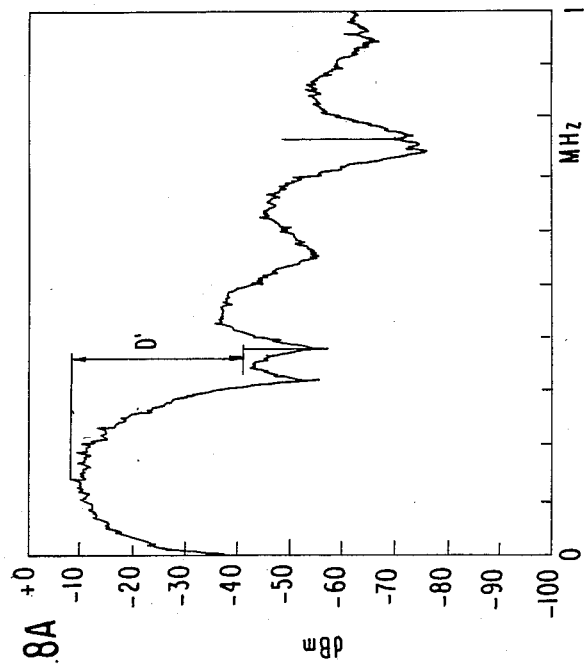
FIG.8A
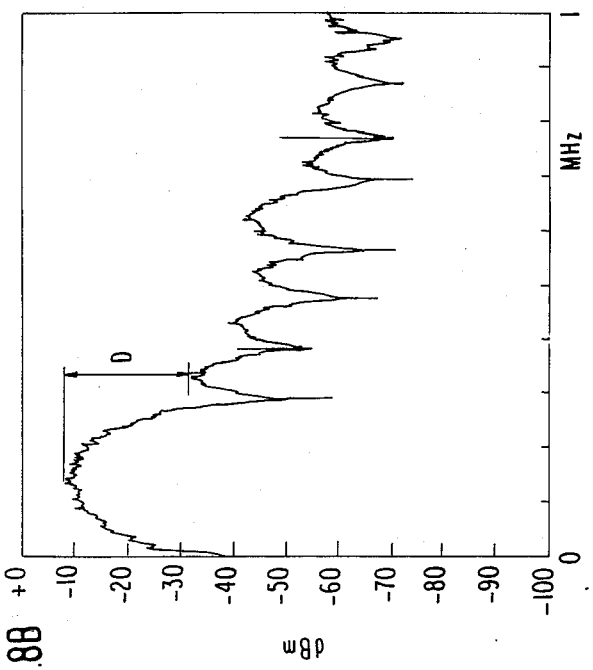
FIG.8B
FIG.7C
| ADDRESS | | | | OUTPUT | STATE |
|---|---|---|---|---|---|
| STATE INDICATION BIT | | INPUT DATA | COUNTER OUTPUT | DATA | |
| S1 | S2 | | | | |
| 0 | 0 | 1 | 0 0 0 0 ... 1 1<br>0 0 1 1 ... 0 1 | DATA OF WAVEFORM A | 1 |
| 1 | 1 | 1 | 0 0 0 0 ... 1 1<br>0 0 1 1 ... 0 1 | | |
| 0 | 0 | 1 | 0 0 0 0 ... 1 1<br>0 0 1 1 ... 0 1 | DATA OF WAVEFORM B | 2 |
| 1 | 1 | 1 | 0 0 0 0 ... 1 1<br>0 0 1 1 ... 0 1 | | |
| 0 | 1 | 0 | 0 0 0 0 ... 1 1<br>0 0 1 1 ... 0 1 | DATA OF WAVEFORM C | 3 |
| 1 | 0 | 0 | 0 0 0 0 ... 1 1<br>0 0 1 1 ... 0 1 | | |
| 0 | 1 | 0 | 0 0 0 0 ... 1 1<br>0 0 1 1 ... 0 1 | DATA OF WAVEFORM D | 4 |
| 1 | 0 | 0 | 0 0 0 0 ... 1 1<br>0 0 1 1 ... 0 1 | | | ns
FSK WITH CONTINUOUS PHASE AND CONTINUOUS SLOPE AT BIT TRANSITIONS

BACKGROUND OF THE INVENTION

The present invention relates to a frequency shift keying (FSK) code generating apparatus for data transmission and more particularly, to a FSK code generating apparatus suitable for subscriber transmission systems.

It has been known that use of AMI (alternate mark inversion) codes in data transmission requires line loss equalization, inconveniently entailing an increase in hardware. To simplify the overall system hardware, a biphase code has been proposed which does not require equalization. The biphase code assigns two states of signal opposite in phase to each of data "1" and "0", and also assigns transitions from state to state to provide a data sequence independent signal. The biphase code, however, has a drawback in that, due to higher frequency components contained therein, the system becomes susceptible to crosstalk in the transmission line and adversely affects other transmission lines nearby.

SUMMARY OF THE INVENTION

It is an object of the present invention to provide an apparatus for generating a FSK code without any higher frequency components to obviate the above-mentioned disadvantages.

According to one aspect of the invention, there is provided a FSK code generator comparising generator means responsive to input data for generating first through fourth digital waveform data for first through fourth states, the first and second digital waveform data including data for $+\sin\theta$ and $-\sin\theta$, respectively, the third and fourth digital waveform data including data for $+f(\theta)$ and $-f(\theta)$, respectively, wherein $$f(\theta) = a + b\left(\frac{\theta}{\pi} - 1\right)^2 + c\left(\frac{\theta}{\pi} - 1\right)^4$$

wherein $0 \leq \theta \leq 2\pi$ and a, b and c are coefficients, the generator means also generating first through fourth state indication signals identifying the first through fourth digital waveform data, respectively. A selector responsive to a control signal selects one of the first through fourth digital waveform data. controller responsive to the input data and any of the first through fourth state indication signals immediately before the state indication signal provides the control signal for the selector. A D/A converter converts any of the first through fourth digital waveform data selected to an analog waveform signal.

BRIEF DESCRIPTION OF THE DRAWINGS

The above and other objects, features and advantages of the present invention will become apparent from the following detailed description when taken with the accompanying drawings in which:

FIGS. 7A, 7B and 7C are tables showing the contents of ROM's employed in the embodiments shown in FIGS. 5 and 6; and FIGS. 8A and 8B show power spectra of the modified FSK code and the conventional biphase code.

In the drawings, the same reference numerals denote the same structural elements.

DESCRIPTION OF THE PREFERRED EMBODIMENTS

Figure 1A:
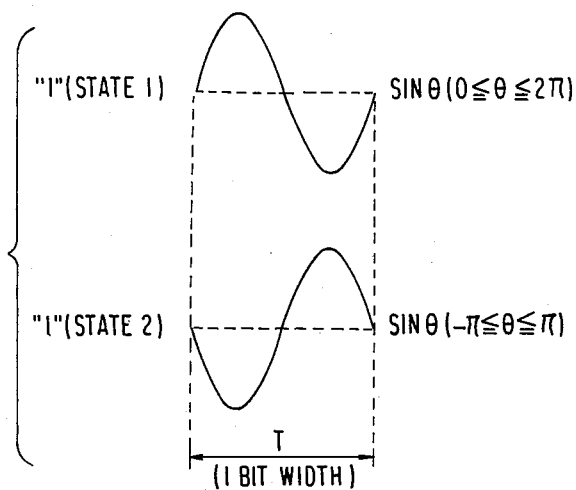
FIGS. 1A and 1B show waveforms of the prior art biphase code.
Figure 1B:
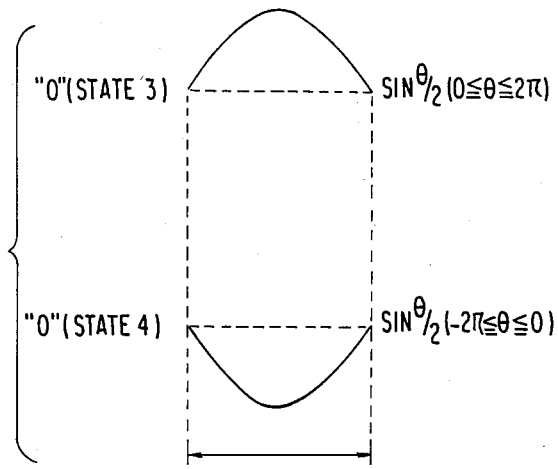
Figure 2:
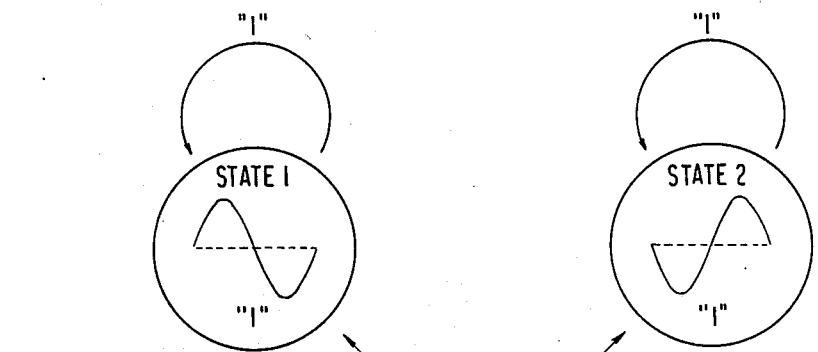
FIG. 2 is an illustration showing state transitions of the biphase code.
Figure 3A:
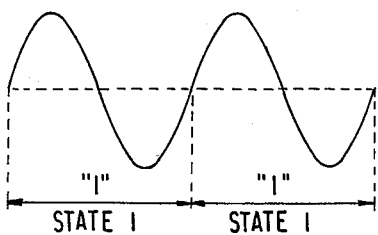
FIGS. 3A through 3H are waveforms depicting defects of the prior art biphase code.
Figure 3B:
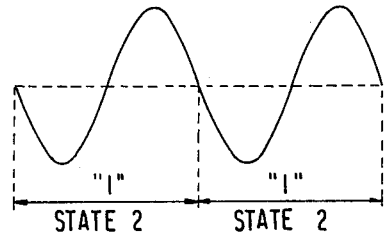
Figure 3C:
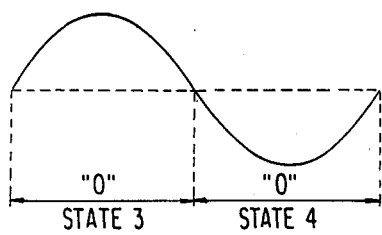
Figure 3E:
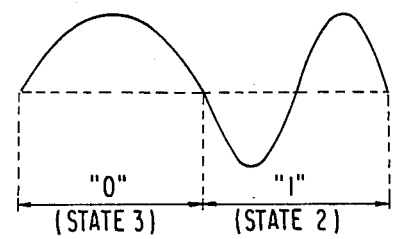
Figure 3D:
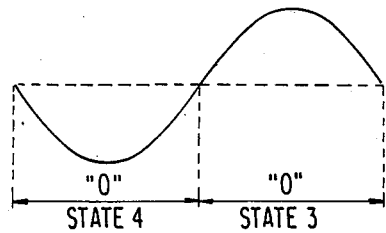
Figure 3F:
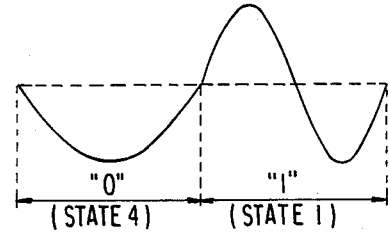
Figure 3G:
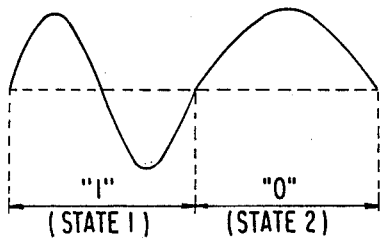

To facilitate understanding of the present invention, the conventional biphase code will now be briefly described. As shown in FIGS. 1A and 1B, a first waveform of function $\sin\theta$ (in 2 modes of $0 \leq \theta \leq 2\pi$ and $-\pi \leq \theta \leq \pi$) and a second waveform of function $\sin\theta/2$ (in 2 modes of $0 \leq \theta \leq 2\pi$ and $-2\pi \leq \theta \leq 0$) are generally used as the biphase code. The first waveform corresponds to a logical state "1" and the second waveform to a logical state "0" herein respectively. As is obvious from FIGS. 1A and 1B, the logical states "1" and "0" have two states or modes each. Therefore, the states of biphase code are identified by both logical state and state of waveform. To maintain phase continuity between the waveforms in the adjacent time slots, however, the waveform state of the time slot immediately following a waveform is limited. Allowable transitions of the states of biphase code are shown in FIG. 2 wherein a state at the base of an arrow shows the state of the present time slot and the state at the head of the arrow shows the state of the next time slot. According to the state transition diagram, the waveform shows smooth connection where the logical state changes from "1" to "1" or "0" to "0" (FIGS. 3A through 3D). Mathematically speaking, the differential coefficients of the two waveforms are equal to each other at the connection point to provide a continuous function or waveform. That is, for instance, $$\sin'\theta/\theta=2\pi = \sin'\theta/\theta=0 = 1$$

The differential coefficients, however, in the logical state change from "1" to "0" or "0" to "1", do not coincide (FIGS. 3E-3H). That is, for instance, $$\sin'\theta/\theta=2\pi = 1 \text{ and } \sin'\theta/2/\theta=0 = \tfrac{1}{2}.$$

Thus, in the prior art biphase code, a discontinuity occurs at the connection point of the two waveforms when the first waveform ($\sin\theta$) shifts into the second waveform ($\sin\theta/2$) or vice versa. Such "discontinuity" suggests that the waveforms contain unnecessary much higher frequency components. Data transmission which employs the waveforms containing such unnecessary higher frequency components is likely to be affected by crosstalk in the transmission line as described in the above, and gives adverse effect to other transmission lines nearby.

In order to obviate the above defects, the present invention employs two functions; $\sin\theta$ for a logical state "1" and the following fourth order even function $f(\theta)$ for a logical state "0";

$$f(\theta) = a + b\left(\frac{\theta}{\pi} - 1\right)^2 + c\left(\frac{\theta}{\pi} - 1\right)^4 \quad (1)$$

wherein $0 < \theta < 2\pi$ and a, b, and c are coefficients which satisfy the following conditions;

(1) the function $\pm f(\theta)$ smoothly continues to $\pm \sin \theta$ when $\theta = 0$ and $\theta = 2\pi$, and (2) the differential coefficient of $\pm f(\theta)$ at $\theta = 0$ equals to that of $\pm \sin \theta$ at $\theta = 2$.

By appropriately deciding the coefficients a, b and c of the function $f(\theta)$, various waveforms shown in FIGS. 4A through 4D to satisfy the above-mentioned conditions are obtained. Hereafter, the waveforms represented by $\pm \sin \theta$ are referred to as waveforms A and B, while the waveforms by $\pm f(\theta)$, waveforms C and D, which correspond to the waveforms shown in FIG. 1B. Also, the waveforms A to D are referred to as a modified biphase code.

Figure 4A:
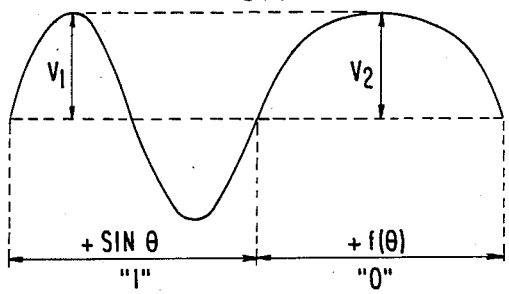
FIGS. 4A through 4D show waveforms of a biphase code employed in the present invention.
Figure 3H:
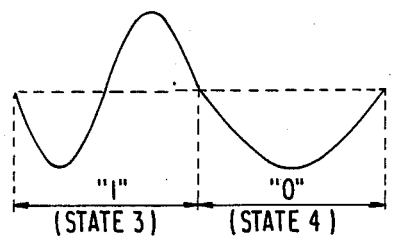
Figure 4B:
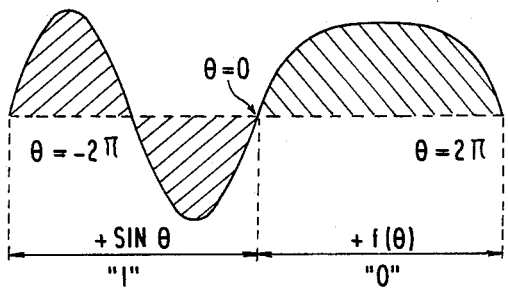
Figure 4C:
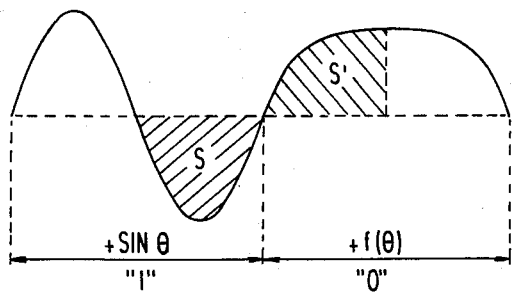
Figure 4D:
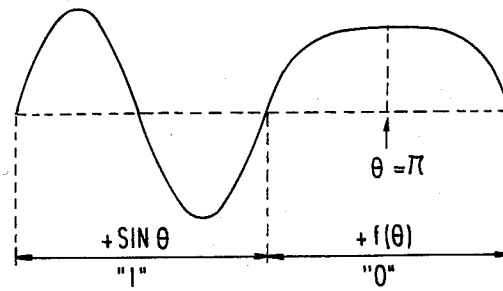

Referring to FIGS. 4A through 4D, there are shown typical waveforms to satisfy the conditions. In FIG. 4A (waveform 1), the function f(8) is determined so that amplitude $V_1$ of waveform A for $\sin \theta$ equals amplitude $V_2$ of waveform C for $f(\theta)$. In FIG. 4B (waveform 2), the powers of $\sin \theta$ and $f(\theta)$ are equal to each other $$\left( \int_{-2\pi}^{0} \sin^2\theta d\theta = \int_{0}^{2\pi} f^2(\theta)d\theta \right);$$

in FIG. 4C (waveform 3), DC components in a half time slot of $\sin \theta$ and $f(\theta)$ are balanced; and in FIG. 4D (waveform 4), the power of $f(\theta)$ is the minimum. It should be noted that although the waveforms A and C, each represented by $+\sin \theta$ and $\pm f(\theta)$ respectively, are used in FIGS. 4A to 4D, waveforms B and D, each represented by $-\sin \theta$ and $-f(\theta)$ respectively, are used as shown in FIG. 3H.

Thus, the waveforms shown in FIGS. 4A to 4D do not have discontinuity eliminating higher frequency components which are otherwise caused by discontinuity at the connection point of the two waveforms.

The values of coefficients a, b and c in the abovementioned waveforms (1) through (4) are given as follows:

Waveform (1): a = 1
Waveform (2):

$$a = \frac{\sqrt{315 - 3\pi^2} - \pi}{16} \approx 0.859495$$

Waveform (3):

$$a = \frac{15}{4\pi} - \frac{\pi}{8} \approx 0.800962$$

Waveform (4):

$$a = \frac{\pi}{4} \approx 0.785398$$

The values b and c in each of the above are determined as follows depending on the value a.

$$b = -2a + \frac{\pi}{2}$$

$$c = a - \frac{\pi}{2}$$

The particular waveform used in accordance with the present invention will be choice of the system designer depending on the system in which the present invention is to be employed. For example, a typical application of the present invention will be for transmission over a subscriber cable. In such a case, since the subscriber cable is a cable pair terminated by a transformer at each end, lower frequency signal components cannot be effectively transmitted without significant distortion. In such a case, waveform 3 shown in FIG. 4C would be preferable due to its DC balanced characteristics.

Figure 5:
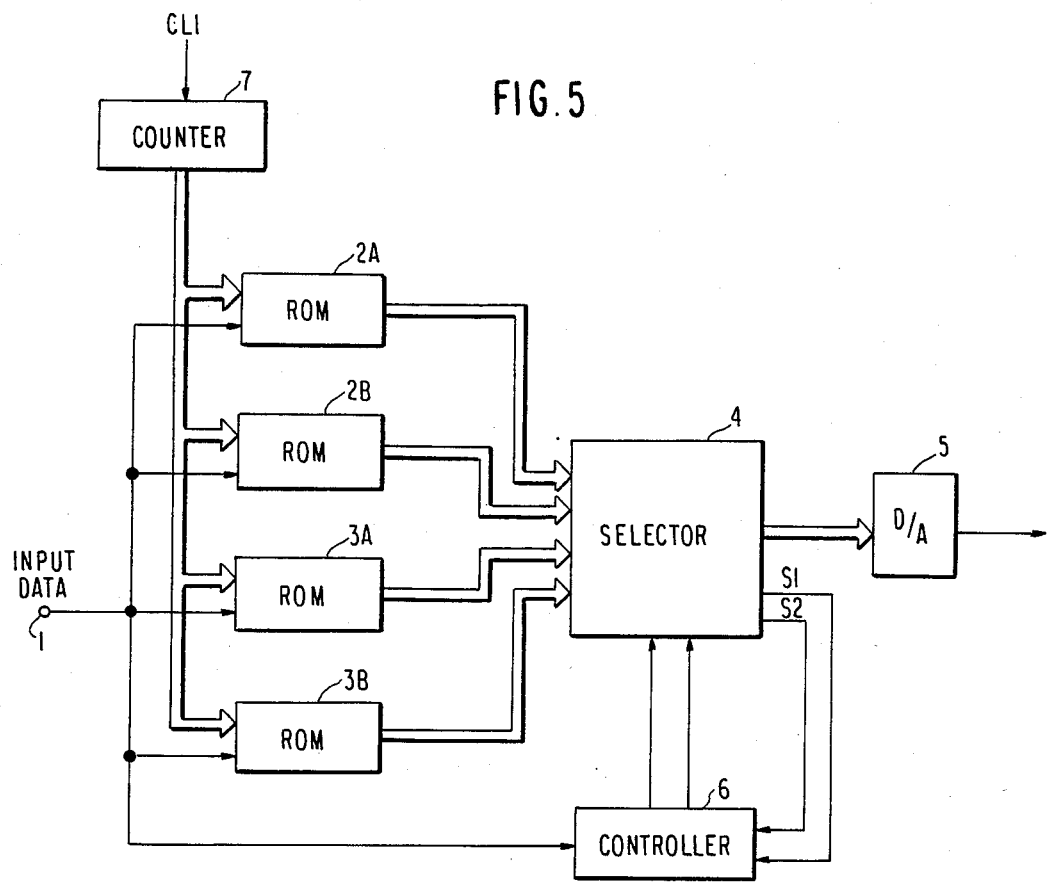
FIG. 5 is a block diagram showing the first embodiment of the present invention.

Referring to FIG. 5, the first embodiment of the present invention includes first and second waveform generators 2A and 2B to generate first and second digital waveform signals represented by $+\sin \theta$ and $-\sin \theta$, respectively, and third and fourth waveform generators A and 3B to generate third and fourth digital waveform signals expressed by functions $+f(\theta)$ and $-f(\theta)$, respectively. The function $f(\theta)$ is expressed by Equation (1). A selector 4 selects one of the first to fourth digital waveform signals and supplies it to a digital to analog (D/A) converter 5. The D/A converter 5 converts the selected digital waveform signal to an analog waveform signal. Each of the waveform generators 2A, 2B, 3A and 3B comprises a read only memory (ROM). A counter 7 supplies a lower part of address to read out each waveform data. In other words, the counter 7 operates at high speed clock pulses CL1 during one time slot of the input data in syncronism with a clock pulse CL2 so as to enable reading out all samples required for that particular time slot. An upper part of address of the respective ROM's are accessed by an input data fed through a terminal 1. Each of the digital waveform signals comprises sampled value data of the waveform (FIG. 7A), and state indication bits S1 and S2 (FIG. 7A) which represent the states of the FSK code shown in FIG. 2. A controller 6 comprising a ROM responds to the state indication bits S1 and S2 and the input signal and supplies the selector 4 with a control signal for selecting the waveform signal. The ROM 6 stores a table shown in FIG. 7B. For example, when the selector 4 outputs data of the waveform A and state indication bits S1 and S2 "00" (FIG. 7A), upon receipt of the input signal "0", the controller 6 produces a control signal "01" (FIG. 7B) to select the generator 3A.

Figure 6:
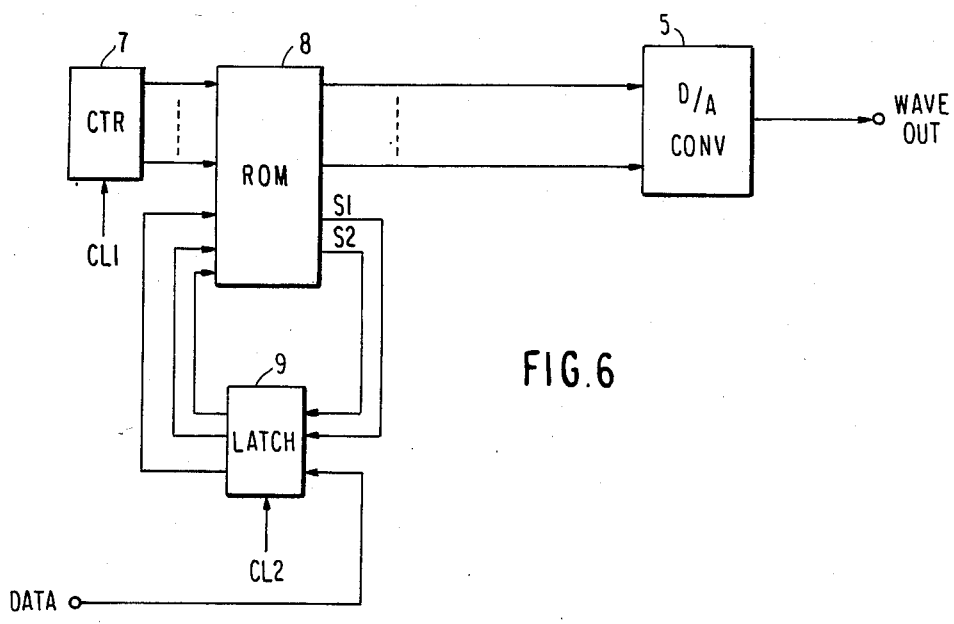
FIG. 6 is a block diagram showing the second embodiment of the present invention.

Referring to FIG. 6, the second embodiment of the present invention realizes the functions of the ROMs 2A, 2B, 3A, 3B and 6 and selector 4 in FIG. 5 with one ROM 8. In FIG. 6, the ROM 8 stores sample value data of the four waveforms A to D obtained from $\pm \sin (\theta)$ and $\pm f(\theta)$ and state indication bits S1 and S2 which indicate transition between the waveforms shown in FIG. 2. The ROM 8 stores a ROM table shown in FIG. 7C. The state indication bits S1 and S2 are supplied to a latch circuit 9 together with the input data. The latch circuit 9 latches the bits S1 and S2 and input data in response to the clock pulse CL2. The input data and the state indication bits S1 and S2 indicate the next state of transition. For example, the STATE 1 in FIG. 2 is transited to the STATE 3 when the input data "0" is supplied. More specifically, upon receipt of the input data "0", the STATE 1 with the state indication bits "00" changes to the STATE 3 because the upper part of the ROM address changes to "000". As in the first embodiment shown in FIG. 5, the counter 7 supplies the lower part of the address to read out of each waveform data.

FIGS. 8A and 8B show the power spectrum of a modified FSK code and a conventional biphase code, respectively. As denoted by "D'" and "D" in the figures, the second side lobe is more suppressed in the modified FSK code than in the prior art biphase code, thereby enabling this invention apparatus to transmit in a band narrower than the prior art.

With the embodiments mentioned above, though four waveforms of $\pm\sin\theta$ and $\pm f(\theta)$ are stored in memory means, waveforms to be stored may include two: $+\sin\theta$ (or $-\sin\theta$) and $+f(\theta)$ (or $-f(\theta)$). In that case, an inverter is required to invert the output of the memory means to produce waveforms by $-\sin\theta$ and $-f(\theta)$.

What is claimed is:

1. An apparatus for generating a frequench shift keying (FSK) code comprising:

generator means responsive to input data for generating first through fourth digital waveform data for first through fourth states, said first and second digital waveform data including data for $+\sin\theta$ and $-\sin\theta$, respectively, said third and fourth digital waveform data including data for $+f(\theta)$ and $-f(\theta)$, respectively, $$f(\theta) = a + b\left(\frac{\theta}{\pi} - 1\right)^2 + c\left(\frac{\theta}{\pi} - 1\right)^4$$

wherein $0 \leq \theta \leq 2\pi$ and a, b and c are nonzero coefficients; said generator means also generating first through fourth state indication signals identifying said first through fourth digital waveform signals; respectively, selector means responsive to a control signal for selecting one of said first through fourth digital waveform data;

controller means responsive to the input data and any of said first through fourth state indication signals immediately before said state indication signal for providing said control signal for said selector means, means for converting any of said first through fourth digital waveform data selected to an analog waveform signal.

2. An apparatus for generating a FSK code set forth in claim 1, said generator means including memory means for storing said first through fourth digital waveform data.

3. An apparatus for generating a FSK code set forth in claim 2, said memory means including first through fourth memory means for storing said first through fourth digital waveform data, respectively.

4. An apparatus for generating a FSK code set forth in claim 1, said generator means including memory means for storing said first and third digital waveform data.

* * * * *

UNITED STATES PATENT AND TRADEMARK OFFICE
CERTIFICATE OF CORRECTION

PATENT NO. : 4,700,364

DATED : October 13, 1987

INVENTOR(S) : Miyazaki et al

It is certified that error appears in the above-identified patent and that said Letters Patent is hereby corrected as shown below:

| | |
|---|---|
| ABSTRACT, LINE 11 | After "and" delete "-f($\Theta$" and insert ---f($\Theta$)--; |
| COLUMN 1, LINE 50 | After "data." insert --A--; |
| COLUMN 3, LINE 23 | Delete "f(8)" and insert --f($\Theta$)--; |
| COLUMN 3, LINE 37 | Delete "± f($\Theta$)" and insert --+f($\Theta$)--; |
| COLUMN 4, LINE 22 | Before "A" insert --3--; |
| COLUMN 5, LINE 24 | Delete "frequeunch" and insert --frequency--. |

Signed and Sealed this

Eleventh Day of October, 1988

Attest:

DONALD J. QUIGG

*Attesting Officer*  *Commissioner of Patents and Trademarks*